(12) United States Patent
Watanabe et al.

(10) Patent No.: US 7,468,531 B2
(45) Date of Patent: Dec. 23, 2008

(54) IMAGING APPARATUS AND RADIATION IMAGING APPARATUS

(75) Inventors: Minoru Watanabe, Saitama-Ken (JP); Chiori Mochizuki, Kanagawa-ken (JP); Takamasa Ishii, Saitama-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 11/625,412

(22) Filed: Jan. 22, 2007

(65) Prior Publication Data
US 2007/0176216 A1  Aug. 2, 2007

(30) Foreign Application Priority Data
Jan. 30, 2006 (JP) .............................. 2006-020979

(51) Int. Cl.
*H01L 31/062* (2006.01)
*H01L 31/113* (2006.01)
(52) U.S. Cl. .................. 257/291; 257/288; 438/30; 349/95
(58) Field of Classification Search ................ 257/288, 257/290, 291, 292; 438/30, 73; 349/95, 349/113, 146
See application file for complete search history.

(56) References Cited

U.S. PATENT DOCUMENTS

| | | | |
|---|---|---|---|
| 4,857,751 A | 8/1989 | Hatanaka et al. | 250/578 |
| 5,073,828 A | 12/1991 | Yamada et al. | 358/482 |
| 5,567,956 A | 10/1996 | Yamanobe et al. | 257/55 |
| 5,680,229 A | 10/1997 | Yamanobe et al. | 358/482 |
| 6,069,393 A | 5/2000 | Hatanaka et al. | 257/434 |
| 6,295,142 B1 | 9/2001 | Watanabe et al. | 358/482 |
| 6,462,806 B2 * | 10/2002 | Zhang et al. | 349/199 |
| 6,600,158 B1 | 7/2003 | Okada et al. | 250/370.11 |
| 6,623,990 B2 | 9/2003 | Watanabe et al. | 438/4 |
| 7,034,309 B2 * | 4/2006 | Mochizuki | 250/370.09 |
| 7,052,980 B2 * | 5/2006 | Aoki | 438/502 |
| 7,126,127 B2 | 10/2006 | Watanabe et al. | 250/370.01 |
| 2004/0159794 A1 | 8/2004 | Morii et al. | 250/370.11 |
| 2006/0077308 A1 | 4/2006 | Mochizuki et al. | 348/800 |
| 2006/0091390 A1 | 5/2006 | Morii et al. | 257/59 |
| 2006/0255239 A1 | 11/2006 | Watanabe et al. | 250/207 |

FOREIGN PATENT DOCUMENTS

| | | |
|---|---|---|
| JP | 11-097660 | 4/1999 |
| JP | 2004-179645 | 6/2004 |

\* cited by examiner

*Primary Examiner*—Phuc T Dang
(74) *Attorney, Agent, or Firm*—Fitzpatrick, Cella, Harper & Scinto

(57) ABSTRACT

An imaging apparatus is provided in which a plurality of pixels, each having a conversion element and a thin-film transistor, are arranged in a two-dimensional fashion on an insulating substrate; the photoelectric conversion element is arranged over the thin-film transistor, with an insulating film, which serves as an interlayer insulating film, inserted between the conversion element and the thin-film transistor; and by way of a contact hole portion provided in the insulating film, the source electrode or the drain electrode of the thin-film transistor and the photoelectric conversion element are connected with each other. The imaging apparatus has a pixel in which the contact hole portion is removed through a laser-beam irradiation so that the connection portion between the conversion element and a conductive layer, which serves as the source electrode or the drain electrode of the thin-film transistor, is discontinued.

8 Claims, 9 Drawing Sheets

IMAGING APPARATUS AND RADIATION IMAGING APPARATUS

BACKGROUND OF THE INVENTION

1. Field of the Invention

The present invention relates to an imaging apparatus in which pixels each having a switching element, such as a thin-film transistor (TFT), and a conversion element for converting a light signal into an electric signal are arranged in a two-dimensional fashion, and to a radiation imaging apparatus utilizing the imaging apparatus and a scintillator. Moreover, the present invention relates to a radiation imaging apparatus utilizing conversion elements for converting radiations into electric signals. Still moreover, the present invention relates to methods for manufacturing the imaging apparatus and the radiation imaging apparatus.

2. Description of the Related Art

In recent years, enlargement of a TFT matrix panel, in which TFTs as switching elements are formed on an insulating substrate, has rapidly been promoted. In addition, techniques for area sensors utilizing switching elements and sensor elements have also been put to practical use. In an area sensor utilized as an imaging apparatus, pixels, in each of which a TFT and a conversion element that serves as a photoelectric conversion element make a pair, are arranged in a matrix form. In the case where an area sensor is utilized as a radiation imaging apparatus, a scintillator, which converts a radiation into light, such as visible light or infrared light, that falls within a wavelength bandwidth that can be sensed by a photoelectric conversion element, is arranged on the area sensor as an imaging apparatus; light from the scintillator is photoelectrically converted by a conversion element that serves as a photoelectric conversion element. Area sensors as radiation imaging apparatuses include an area sensor utilizing TFTs and conversion elements made of a semiconductor conversion material that converts a radiation directly into an electric signal.

With regard to the foregoing imaging apparatus and the radiation imaging apparatus, enhancement of the sensitivity of a conversion element and the driving speed of a switching element have also been promoted. For the purpose of achieving the high sensitivity and the high speed, a laminate-structure pixel in which a conversion element is arranged on a switching element or a wiring connected to a switching element is desirable.

An imaging apparatus having pixels of the foregoing laminated structure is described in Japanese Patent Application Laid-Open No. H11-097660.

To date, in a laminate-structure imaging apparatus or a laminate-structure radiation imaging apparatus in which, after TFTs are formed, conversion elements are formed, proposals have been made in which, in the case where a defect is caused in a pixel, the defective pixel is electrically isolated by means of a laser beam so as to be removed without affecting the peripheral pixels.

In an imaging apparatus or a radiation imaging apparatus that is disclosed, as a conventional example, in the specification of US Patent Publication No. 2004-159794 (Japanese Patent Application Laid-Open No. 2004-179645), semiconductor conversion elements are arranged on switching elements. In addition, it is described that the imaging apparatus or the radiation imaging apparatus is formed in such a way that part of an electrode of the conversion element within a region onto which a laser beam is irradiated is removed.

Additionally, the lower electrode of the conversion element is provided with an opening on the corresponding TFT. As a result, in the case where a defect is caused in a conversion element of a pixel, by irradiating a laser beam through the corresponding opening onto the TFT, thereby electrically isolating the TFT from the conversion element.

In the imaging apparatus or the radiation imaging apparatus that is disclosed in US Patent Publication No. 2004-159794 (Japanese Patent Application Laid-Open No. 2004-179645), a lower electrode and a second semiconductor layer that configure a semiconductor conversion element are arranged in such a way as to avoid the top side of the corresponding TFT. Since the TFT is covered with neither the lower electrode nor the second semiconductor layer, visibility for the TFT portion is enhanced when the remove is carried out, whereby alignment can be made without mixing up a portion to be removed with a wrong portion.

SUMMARY OF THE INVENTION

The configuration as disclosed in US Patent Publication No. 2004-159794 (Japanese Patent Application Laid-Open No. 2004-179645) lowers electric-charge collection efficiency for incident light to the top side of a TFT that serves as a switching element. This is because, even though light enters an amorphous silicon layer in the top portion of the TFT, the functionality of a conversion element is deteriorated, due to the following two reasons:

(1) In the top and bottom portions of the amorphous silicon layer, a region to which an amorphous-silicon depletion voltage is applied and a region to which the amorphous-silicon depletion voltage is not applied are intermingled.

(2) A region is produced where electric charges cannot be collected through the lower electrode that works as a distinct electrode of a conversion element.

Moreover, in the case where the amorphous silicon for a conversion element on a switching element is removed, the function to be possessed by a photoelectric conversion element is fully rescinded on the switching element, thereby reducing the sensitivity.

In this case, when the lower electrode and the amorphous silicon layer of a conversion element are laminated on a switching element, visibility for the switching element is extremely deteriorated. As a result, in the case where a defect is caused in a conversion element, even though, in order to electrically isolate the defective portion, it is tried to separate the conversion element from the corresponding switching element, by irradiating a laser beam or the like onto the switching element, stable working cannot be performed. Accordingly, the TFT is broken, so that the short-circuit between the gate electrode and the source electrode and/or the drain electrode is caused.

Thus, a method is required in which, even though a defect is caused in a conversion element, the defect is electrically isolated in a stable and accurate fashion, without breaking the corresponding switching element, while keeping the configuration in which the conversion element is placed on a TFT and a given aperture ratio for the conversion element is ensured. In consequence, the objective of the present invention is to provide an imaging apparatus that can readily be removed and has a high aperture ratio.

An imaging apparatus according to the present invention is provided in which a plurality of pixels arranged on an insulating substrate, each of the plurality of pixels comprising: a thin-film transistor having a source electrode and a drain electrode; a conversion element arranged over the thin-film transistor; and an insulating film arranged between the thin-film transistor and the conversion element, wherein the plurality of pixels include a pixel in which, through a contact hole provided in the insulating film, the source electrode or the drain electrode of the thin-film transistor and the conversion element are connected with each other; and a pixel in which the conversion element, the insulating film, and an electro-conductive layer electrically connected to the source electrode or the drain electrode of the thin-film transistor are removed together so that an electric connection between the thin-film transistor and the conversion element is discontinued.

A radiation imaging apparatus according to the present invention utilizes the imaging apparatus and is characterized in that a scintillator for converting a radiation into light is provided on the conversion element.

Moreover, a radiation imaging apparatus according to the present invention is provided in which a plurality of pixels, each having a conversion element that converts a radiation into an electric signal and a switching element that is connected with the conversion element, are arranged on an insulating substrate; the conversion element is arranged over the switching element, with an interlayer insulating film inserted between them; and by way of a contact hole portion provided in the interlayer insulating film, the switching element and the conversion element are connected with each other. The radiation imaging apparatus is characterized in that the plurality of pixels include a pixel in which the contact hole portion is removed so that the connection between the conversion element and the switching element is discontinued.

Still moreover, a manufacturing method, according to the present invention, for an imaging apparatus in which a plurality of pixels, each having a conversion element that converts a light signal into an electric signal and a switching element that is connected with the conversion element, are arranged on an insulating substrate; the conversion element is arranged over the switching element, with an interlayer insulating film inserted between them; and by way of a contact hole portion provided in the interlayer insulating film, the switching element and the conversion element are connected with each other is characterized in that the connection between the conversion element and the switching element is discontinued, by removing each of the contact holes in part of the plurality of pixels.

Furthermore, a radiation imaging system according to the present invention is characterized by including the radiation imaging apparatus, signal processing means for processing a signal from the radiation imaging apparatus, recording means for recording a signal from the signal processing means, display means for displaying a signal from the signal processing means, transmitting means for transmitting a signal from the signal processing means, and a radiation generating source for generating radiations.

Radiations as termed in the present application include a particle ray such as an α-ray or a β-ray, an X-ray and a γ-ray.

According to the present invention, even though a defect is caused in the conversion element, the switching element and the conversion element are electrically isolated from each other in a stable and accurate fashion, while keeping a given aperture ratio for the conversion element is ensured, whereby the yield rate in manufacturing imaging apparatuses or radiation imaging apparatuses can be enhanced. Thus, it is made possible to provide an imaging apparatus and a radiation imaging apparatus inexpensively and stably.

Further features of the present invention will become apparent from the following description of exemplary embodiments with reference to the attached drawings.

DESCRIPTION OF THE EMBODIMENTS

Embodiments of the present invention will specifically be explained below with reference to the accompanying drawings.

In each embodiment below, the explanation will focus on a case where a radiation imaging apparatus is configured; however, the present invention is not limited to a radiation imaging apparatus that converts a radiation into an electric signal, but can be applied also to an imaging apparatus that converts light such as visible light or infrared light into an electric signal.

First Embodiment

In the first place, First Embodiment of the present invention will be explained.

Figure 1A:
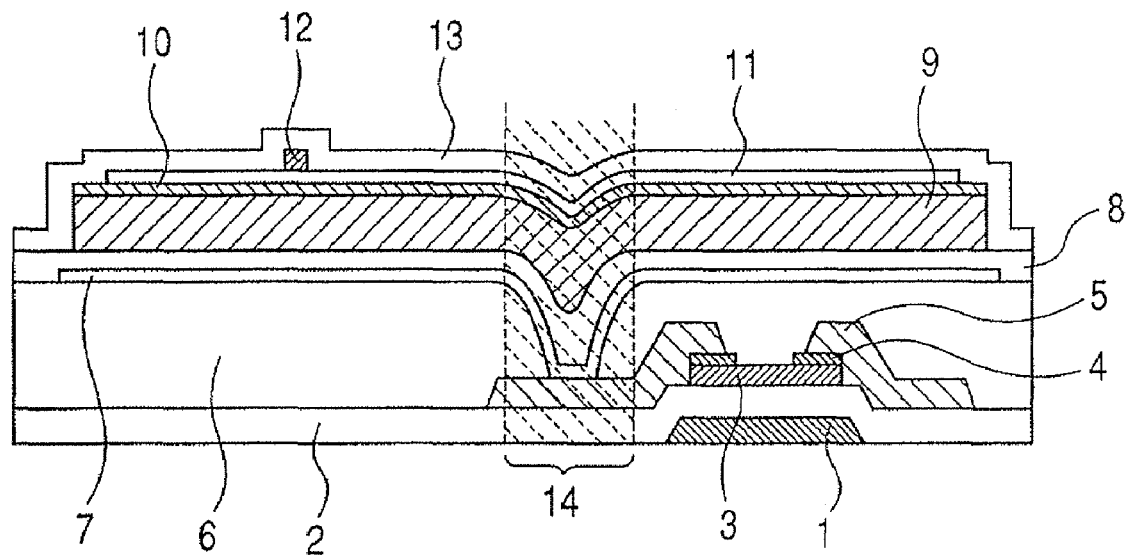
FIG. 1A is a cross-sectional view of a pixel according to First Embodiment of the present invention in the case where repair through a laser beam has not been carried out.
Figure 1B:
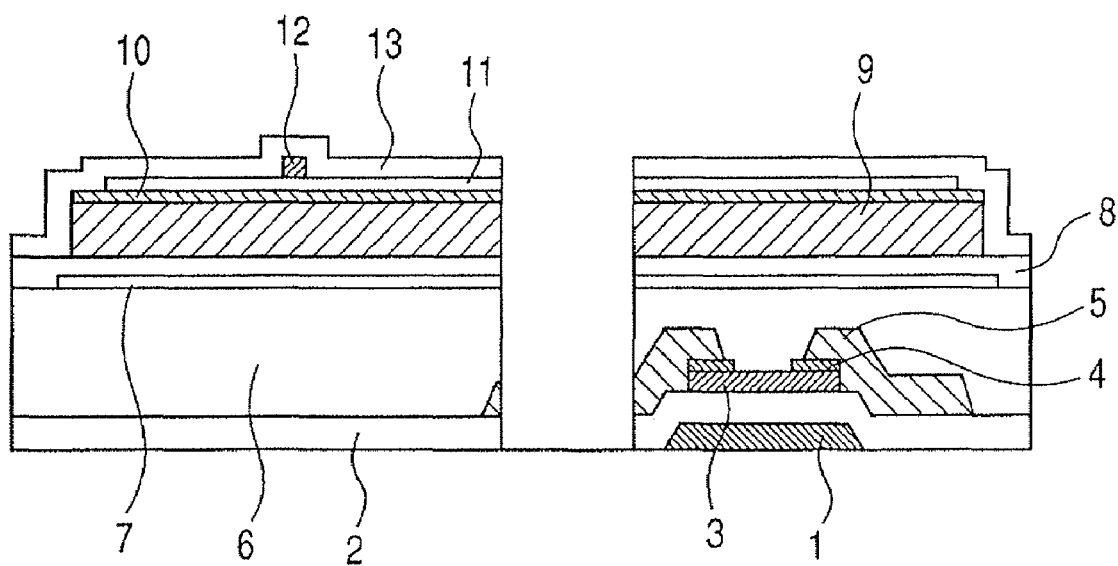
FIG. 1B is a cross-sectional view of a pixel according to First Embodiment of the present invention in the case where repair through a laser beam has been carried out.

FIGS. 1A and 1B are each a cross-sectional view of a pixel of a radiation-imaging sensor panel that serves as an imaging apparatus according to First Embodiment of the present invention; in the pixel, a TFT, an interlayer insulating film, and a conversion element are laminated in that order on a substrate. FIG. 1A is a cross-sectional view in the case where laser-beam repair has not been carried out; FIG. 1B is a cross-sectional view in the case where the laser-beam repair has been carried out.

Figure 2A:
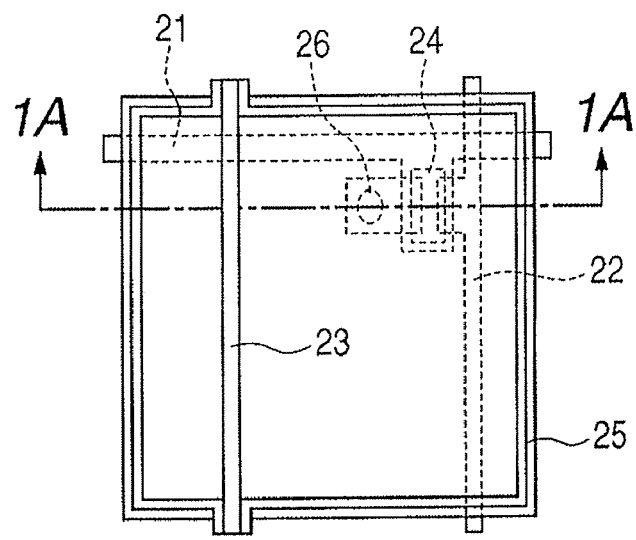
FIG. 2A is a plan view of a pixel according to First Embodiment of the present invention.
Figure 2B:
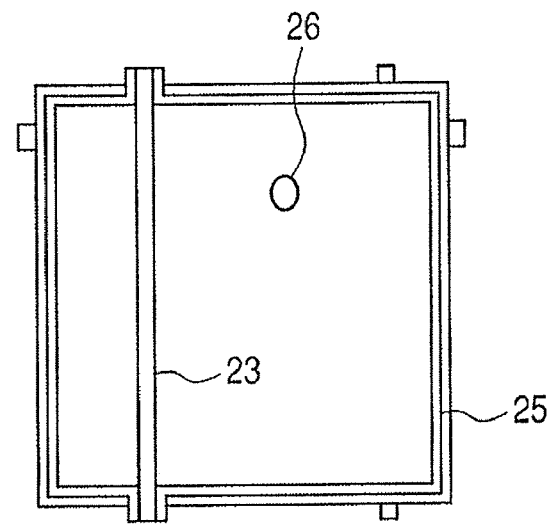
FIG. 2B is a plan view illustrating the appearance of a pixel according to First Embodiment of the present invention.
Figure 2C:
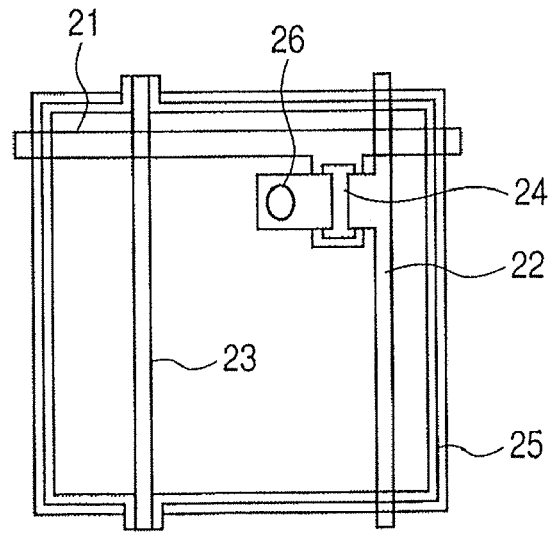
FIG. 2C is a plan view illustrating the appearance of the pixel illustrated in FIG. 1A in the case where a second insulating layer, having an approximately average film thickness, is arranged in the pixel.

FIGS. 2A to 2C are each a view illustrating the top-view structure of a pixel having the cross-sectional structure in FIGS. 1A and 1B. FIG. 2A is a plan view; FIG. 2B is an imaginary external view in the case where a pixel having the cross-sectional structure illustrated in FIG. 1A is observed through a reflection-type optical microscope. In addition, FIG. 2C is an imaginary external view of a pixel, observed through a reflection-type optical microscope, which has the cross-sectional structure illustrated in FIG. 1A and in which an insulating layer having no flattening characteristic is utilized for the second insulating layer 6. Here, FIG. 1A is a cross-sectional view, taken along the plane 1A-1A in FIG. 2A, of the pixel.

The conversion element utilized in a radiation imaging apparatus according to First Embodiment is an element that converts light such as visible light or infrared light into an electric signal (serves as a photoelectric conversion element), or an element that converts a radiation such as a particle ray such as an α-ray and a β-ray, an X-ray, or a γ-ray into an electric signal. In the case where a conversion element (a photoelectric conversion element) that does not directly convert a radiation, e.g., that converts light such as visible light into an electric signal is utilized, a scintillator (unillustrated), which converts a radiation into light, such as visible light or infrared light, that falls within a wavelength bandwidth that can be sensed by the conversion element, is disposed on the conversion element. In the descriptions below, the explanation will focus on a case where a conversion element (a photoelectric conversion element), which converts light into an electric signal, is utilized.

As illustrated in FIG. 1A, in a pixel of the radiation imaging apparatus according to First Embodiment, a thin-film transistor (TFT) that is formed on a substrate and serves as a switching element has a first conductive layer 1 that serves as the gate electrode, a first insulating layer 2 that serves as the gate insulating layer, and a first semiconductor layer 3 that serves as the channel portion. Additionally, the TFT has a first impurity semiconductor layer 4 that serves as the ohmic contact layer and a second conductive layer 5 that serves as the source and drain electrodes.

Additionally, a conversion element that serves as the photoelectric conversion element is configured as a MIS (Metal-Insulator-Semiconductor)-type element including a third conductive layer 7 that serves as the lower electrode, a third insulating layer 8, a second semiconductor layer 9 that serves as the photoelectric conversion layer, a second impurity semiconductor layer 10, a fourth conductive layer 11 that is transparent and serves as the upper electrode, a fifth conductive layer 12 that serves as the bias wiring. Reference numeral 13 denotes a protection layer.

In the case where the conversion element is an element for converting a radiation directly into an electric signal, a material, which can convert a radiation directly into an electric signal, is utilized for the second semiconductor layer 9. In addition, a configuration may be employed in which the third insulating layer 8 is replaced by an impurity semiconductor layer. Additionally, the fourth conductive layer 11 may not necessarily be translucent, whereby it is not required to utilize a transparent conductive layer, which has a relatively high resistance value; therefore, the fifth conductive layer may be omitted.

The conversion element is disposed over the TFT, with the second insulating layer 6 inserted between them, thereby ensuring a high aperture ratio. The lower electrode of the conversion element, formed of the third conductive layer 7, is connected, by way of a contact hole portion 26 illustrated in FIGS. 2A to 2C, to the drain electrode, of the TFT as a switching element, which is formed of the second conductive layer 5.

In First Embodiment, in the case where the intrusion of foreign materials into the conversion element or a defect in lithography is caused, the conversion element is electrically isolated from the switching element, thereby preventing the neighboring pixels from being adversely affected, whereby the substrate can be utilized as a conforming item. Thus, by irradiating a laser beam onto a laser-beam irradiation region 14 so as to remove the films, the conversion element is electrically isolated from the switching element. It is conceivable that, in the case where the intrusion of foreign materials into the conversion element or a defect in lithography is caused, the source electrode or the drain electrode of the TFT as a switching element is removed by means of a laser beam. However, in the case of a configuration, as illustrated in FIG. 1A, in which a conversion element is disposed over a TFT, microscopic light is absorbed by the conversion element; therefore, the position of the source electrode or the drain electrode cannot be recognized, whereby a wrong working position may be taken. If the level-difference contour of the TFT is transferred onto the conversion element, the position of the source electrode or the drain electrode can be recognized, by utilizing reflected light. However, if, as illustrated in FIG. 1A, the second insulating layer 6 is an insulating film (an organic flattened film which is formed through a reflow process) having a flattening characteristic, or a film that has been flattened through the CMP, the level-difference contour of the TFT is not transferred onto the conversion element; therefore, even by unitizing reflected light, it is difficult to recognize the position.

In contrast, as illustrated in FIGS. 1A and 2B, the contact hole portion, which connects the conversion element with the TFT, makes it possible to readily recognize the level-difference portion when the external contour is observed through microscopic light. The contact hole portion is a connection portion between the conversion element and the TFT; thus, by irradiating a laser beam so as to remove the films, the electrical connection can readily be isolated without taking a wrong working position.

FIG. 1B is a cross-sectional view of the pixel in the case where a laser beam has actually been irradiated onto the laser-beam irradiation region 14 illustrated in FIG. 1A and the films have been removed. As illustrated in FIG. 1B, it is possible to disconnect the TFT as a switching element from the conversion element. However, in fact, the films that have been removed through a laser beam may adhere again to the worked cross section. Accordingly, when the film thickness of the second insulating layer 6 is small, a conductive film that has adhered again may create a short circuit between the lower electrode of the conversion element, formed of the third conductive layer 7, and the drain electrode of the TFT, formed of the second conductive layer 5. For that reason, the larger the film thickness of the second insulating layer 6 is, the better the isolation is; therefore, although depending on the dielectric constant, it is practically desirable that, in the vicinity of the laser-beam irradiation region 14, the film thickness of the second insulating layer 6 is 1.0 µm or larger. In addition, in the case where the lower electrode of the conversion element is not required to be low-resistance, the amount, of the lower electrode, to be removed through a laser beam can be reduced, by reducing the film thickness of the lower electrode, e.g., to 0.1 µm or smaller; as a result, the amount of films that adhere again after the irradiation of a laser beam can be reduced, whereby the isolation is far better.

In FIGS. 1A and 1B, a MIS-type conversion element is utilized as the conversion element having a photoelectric-conversion function (the photoelectric conversion element); however, a PIN-type conversion element may be utilized. By forming on the photoelectric conversion element a scintillator, such as a CsI, for converting a radiation into light, such as visible light and infrared light, that falls within a wavelength bandwidth that can be sensed by the photoelectric conversion element, a radiation imaging apparatus can be configured. In addition, the third insulating layer 8 of the conversion element may be replaced by an impurity semiconductor layer, and the material for the semiconductor layer 9 may be changed from an amorphous silicon, which is utilized as a material for photoelectric conversion, to a material, such as an amorphous selenium, a lead iodide, and a cadmium telluride, that converts a radiation directly into an electric signal. In this case, a radiation imaging apparatus can be configured without providing any scintillator.

A bottom-gate, gap-etching type TFT is utilized for the TFT as a switching element; however, an etch-stopper type TFT, a top-gate type TFT, or an LDD-structure polysilicon TFT may be utilized.

In addition, an organic flattened film such as a polyimide or an acrylic film, an insulating film produced through a reflow process, a CVD film produced by means of an organic-silicon-system siloxane material gas, a boron-phosphorous-doped oxide film, or the like, which has a flattening characteristic, may be utilized for the second insulating layer 6. Additionally, a non-flattened film such as a silicon nitride film formed through the plasma CVD or a silicon oxide film may be utilized.

FIG. 2A is a plan view of the pixel as illustrated in FIG. 1A. A TFT 24 and a conversion element 25 make a pair; in practice, a plurality of the pixels illustrated in FIG. 2A are arranged in a matrix fashion.

The TFT 24, and a gate wiring 21 and a signal wiring 22 that are connected with the TFT 24 are arranged under the conversion element 25. The upper electrode of the conversion element 25 is connected with a bias wiring 23. By arranging the conversion element over the TFT 24 and the wiring, a sufficient aperture ratio for the conversion element 25 can be ensured; as a result, the conversion element can have a high sensitivity.

FIG. 2B is an imaginary external view of the cross-sectional structure illustrated in FIG. 1A. As illustrated in FIG. 2B, when the cross-sectional-structure pixel illustrated in FIG. 1A is observed through a reflection-type optical microscope, the TFT 24 and the respective wiring connected with the TFT 24 cannot optically be recognized. In addition, when, as illustrated in FIG. 1A, an insulating film having a flattening characteristic is utilized for the second insulating layer 6, the contour of the TFT 24 is flattened by the insulating film, whereby the level-difference contour cannot be recognized, either.

It is assumed that a foreign material adheres, for example, in a manufacturing process, to the conversion element formed in the upper portion, thereby causing a defect. In this situation, even though, in order to disconnect the TFT 24 from the conversion element 25, it is required to remove by means of a laser beam the source or the drain electrode of the TFT 24 or the wiring so as to electrically isolate the defective portion, the laser-beam irradiation position cannot be determined, for the foregoing reason. Due to the above reason or the like, in an imaging apparatus and a radiation imaging apparatus configured in such a way that a conversion element is disposed over the TFT 24, it is required to remove, by means of a laser beam, portions that are readily recognized from above.

In consequence, a method of irradiating a laser beam onto the contact hole portion 26 in FIG. 2B so as to separate the connection portion is the working method that provides a superior accuracy in the working position and enables the TFT 24 and the conversion element 25 to be stably and electrically isolated from each other.

In this situation, as described above, the larger the film thickness of the second insulating layer 6 illustrated in FIG. 1A is, the more readily the TFT 24 and the conversion element 25 are electrically isolated from each other. Moreover, by enlarging the film thickness of the second insulating layer 6, the capacitance of the capacity formed between the conversion element 25 and the TFT 24 can be reduced, whereby noise in an imaging apparatus or a radiation imaging apparatus can be diminished. Still moreover, by enlarging the film thickness of the second insulating layer 6, the external contrast of the contact hole portion 26 is enhanced in the appearance that is recognized through a reflection-type optical microscope; therefore, the positional recognition in irradiating a laser beam is further facilitated.

FIG. 2C is an imaginary external view, through a reflection-type optical microscope, of the cross-sectional structure in FIG. 1A in the case where the second insulating layer 6 does not have a flattening characteristic. Even in this case, owing to the level differences in the TFT 24, it is barely possible to optically recognize the TFT 24 and the respective wiring connected with the TFT 24; however, because the recognition is limited to the detection of the edges of the conductive layer, the accuracy in detecting the position of each portion is lowered, whereby laser beam irradiation position is not stabilized.

As described above, the larger the film thickness is, the better the second insulating layer 6 illustrated in FIG. 1A is, due to the following reason:

(1) To prevent a short circuit from being created after the laser irradiation, due to the re-adhesion of removed films (2) To diminish the capacitance of the capacity formed between the TFT 24 and the conversion element 25 so as to provide a low-noise conversion element (3) To enhance the accuracy in positional recognition through a reflection-type optical microscope Accordingly, it is desirable that the film thickness of the second insulating layer 6 is 1.0 µm or larger. In consequence, even in the case where, as illustrated in FIG. 2C, the second insulating layer 6 does not have a flattening characteristic, the position of the contact hole potion 26 having a large absolute level difference is readily detected. Thus, by removing the contact hole portion 26 by means of a laser beam, a defective portion can be stably and electrically isolated.

Figure 3:
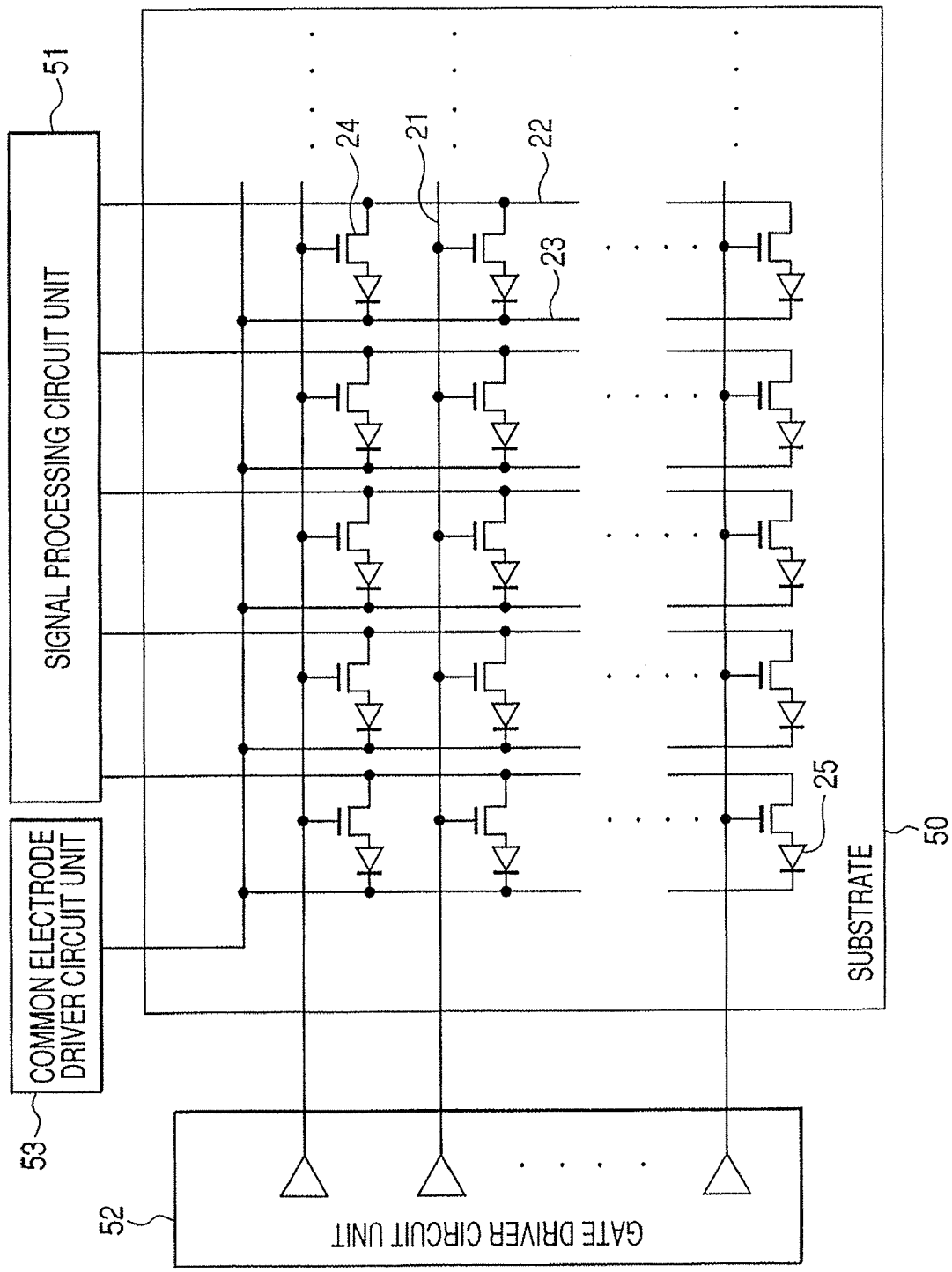
FIG. 3 is a simplified equivalent circuit diagram for an imaging apparatus according to First Embodiment of the present invention.

FIG. 3 is a simplified equivalent circuit diagram for an imaging apparatus including pixels each having a cross-sectional structure in FIG. 1A.

FIG. 3 is a simplified equivalent circuit diagram for an imaging apparatus according to the present invention. On a substrate 50, pixels, in each of which the TFT 24 that serves as a switching element and the conversion element 25 that serves as a photoelectric conversion element make a pair, are arranged in a matrix form. In addition, the gate wiring 21 and the signal wiring 22, which are connected with the TFT 24, and the bias wiring 23, which is connected with the conversion element 25, are connected with a gate driver circuit unit 52, a signal processing circuit unit 51, and a common electrode driver circuit unit 53, respectively. By applying a TFT-ON voltage to the gate wiring 21 controlled by the gate driver circuit unit 52, a signal whose magnitude is in proportion to the number of carriers that are created when visible light enters the imaging apparatus through an unillustrated scintillator can be transferred to the signal processing circuit unit 51. The bias wiring 23 connected with the common electrode driver circuit unit 53 is controlled in such a way as to apply a constant electric potential. In addition, in the case where the conversion element 25 is a MIS-type photoelectric conversion element, by controlling the electric potential to be applied to the bias wiring 23, accumulated holes and electrons can be removed. In the case where the conversion element 25 is an element that converts a radiation directly into an electric signal, no scintillator is provided on the conversion element. In addition, instead of having a quadrangular shape as illustrated in FIGS. 2A to 2C, the conversion element may have another shape such as a honeycomb shape. Moreover, FIG. 3 illustrates pixels, each including the conversion element and the switching element, that are arranged in a matrix fashion; however, the arrangement has only to be two-dimensional, e.g., the arrangement may be honeycomb-shape. With regard to the scintillator, a scintillator material such as a CsI may be placed directly on the protection layer 13, or a scintillator layer, such as a CsI, that is provided on a carbon plate or a carbon film may be adhered to a radiation-imaging sensor panel as illustrated in FIGS. 1A and 1B, with an adhesion layer inserted between them.

Figure 6:
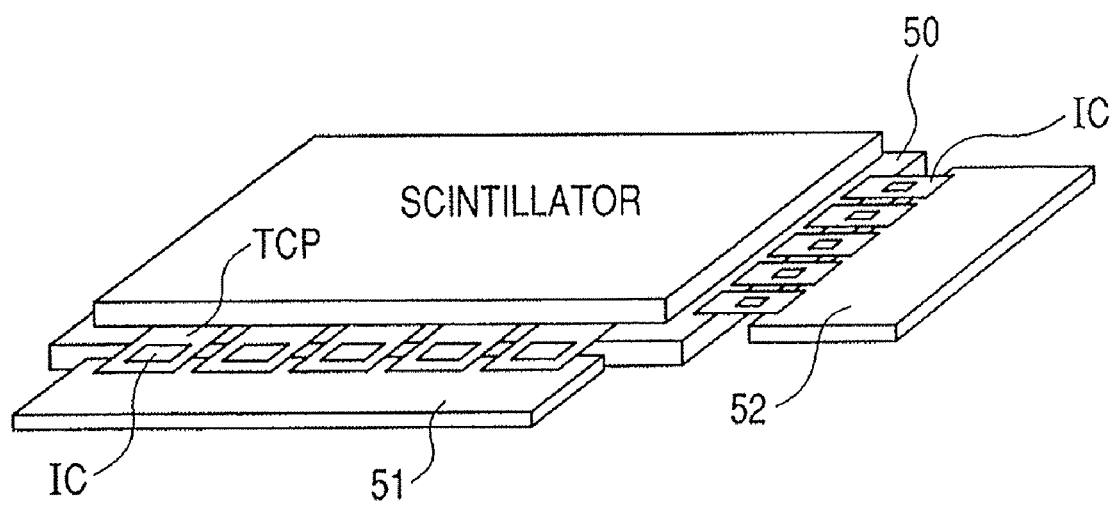
FIG. 6 is a view illustrating a radiation imaging apparatus in which pixels according to First Embodiment are arranged.

FIG. 6 is a view illustrating an example of a radiation imaging apparatus in which pixels according to First Embodiment are utilized, a scintillator 54 that converts a radiation into light such as visible light is placed on the pixels, and the gate driver circuit unit 52 and the signal processing circuit unit 51 are provided in the peripheral portion thereof. The common electrode driver circuit unit 53, which is unillustrated, is provided at the side, of the radiation imaging apparatus, where the signal processing circuit unit 51 is provided. In the case where, as the conversion element, an element that converts a radiation into light such as visible light is utilized, the scintillator 54 is not required.

Next, an example in which the laser-beam irradiation region is different from that in FIGS. 1A and 1B will be explained.

Figure 4A:
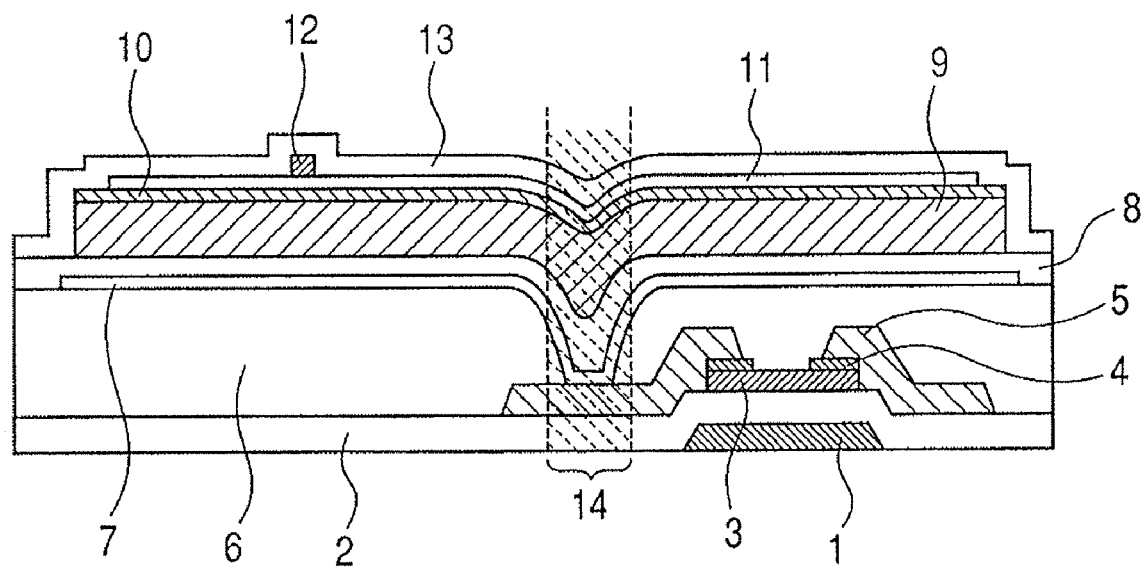
FIG. 4A is a cross-sectional view of a pixel according to First Embodiment of the present invention in the case where repair through a laser beam has not been carried out.

FIG. 4A, which is a cross-sectional view of the same pixel as that in FIG. 1A, illustrates an example in which the laser-beam irradiation region 14 is smaller than that in FIG. 1A; FIG. 4A illustrates the cross-sectional view before laser-beam irradiation and FIG. 4B, after laser-beam irradiation. FIG. 5 is a cross-sectional view illustrating an example in the case where the laser-beam irradiation region is larger than that in FIG. 1B. In addition, constituent members identical to those in FIG. 1 are designated by identical reference numerals and the explanation therefor will be omitted.

Figure 4B:
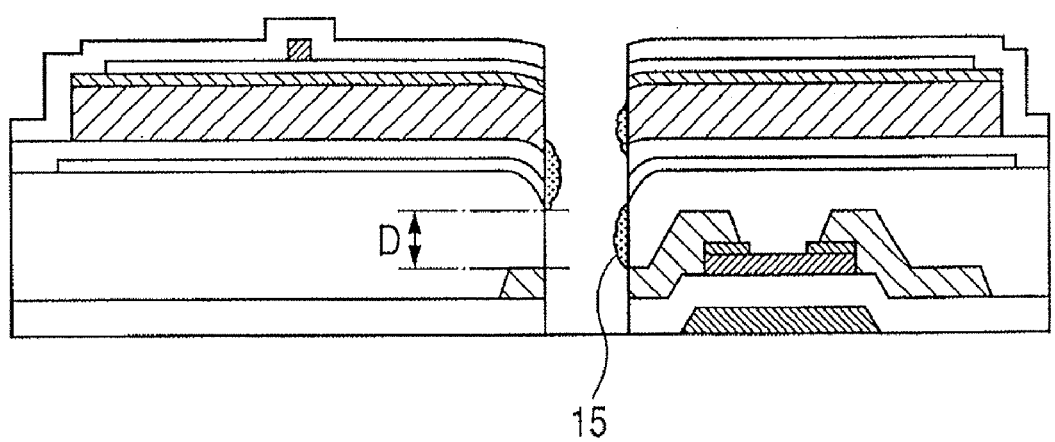
FIG. 4B is a cross-sectional view of a pixel according to First Embodiment of the present invention in the case where repair through a laser beam has been carried out.
Figure 5:
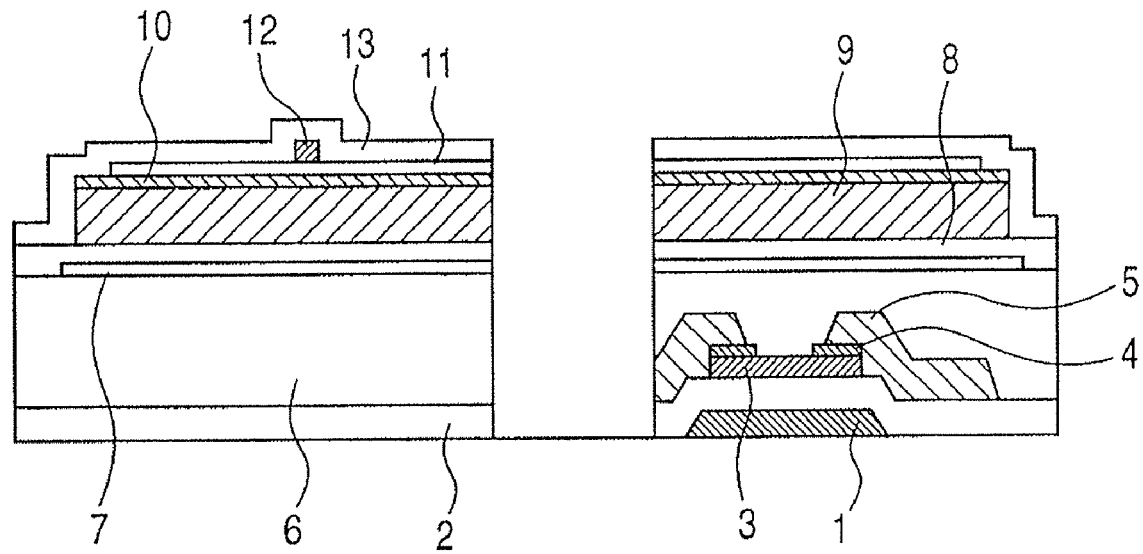
FIG. 5 is a cross-sectional view of a pixel according to First Embodiment of the present invention.

As illustrated in FIG. 4A, when the laser-beam irradiation region is narrowed and the films at a tapered portion of the contact hole portion 26 are removed, the distance D between the TFT portion at the position where the films have been removed and the conversion element becomes small; therefore, as illustrated in FIG. 4B, a removed film may adhere as a re-adhesion film 15. In this case, it is conceivable that, even though the films are removed, an electric short circuit is created because of the re-adhesion film 15, thereby causing the yield rate to be lowered. Accordingly, it is desirable that the distance, initially ensured through the second insulating film, between the TFT and the conversion element is made sufficiently large, and the laser-beam film removal is not carried out at a portion of the contact hole portion 26 where it is difficult to control the distance, especially at the tapered portion of the contact hole portion. As described above, it is desirable that the film thickness of the second insulating film is 1.0 µm or larger; the larger the film thickness of the second insulating film is, the more readily the TFT and the conversion element are electrically isolated from each other through the laser-beam film removal. Additionally, it is desirable that removal is carried out in such a way that the contact hole portion 26 to be removed includes the tapered portion thereof.

FIG. 5 is a cross-sectional view, taken along the same plane as that in the case of FIG. 1A, in the case where the laser-beam irradiation region 14 is made wider than that in FIG. 1A and the film for TFT drain electrode is positively removed. As a result, although the amount of the films removed through a laser beam increases, the area of the remaining drain electrode is reduced, whereby even though, for example, the re-adhesion of the removed film is caused, the probability that a short circuit is created between the TFT and the conversion element is diminished, thereby enhancing the yield rate.

As described above, by removing through a laser beam the films in the contact hole portion 26 that connects the TFT with the conversion element, even when a defect is caused in the conversion element, the defect is electrically isolated so that working can be performed without affecting the neighboring pixels.

Second Embodiment

In the first place, Second Embodiment of the present invention will be explained.

FIGS. 7A to 9D are each a plan view of a pixel of a radiation-imaging sensor panel that serves as an imaging apparatus according to Second Embodiment of the present invention.

Figure 7A:
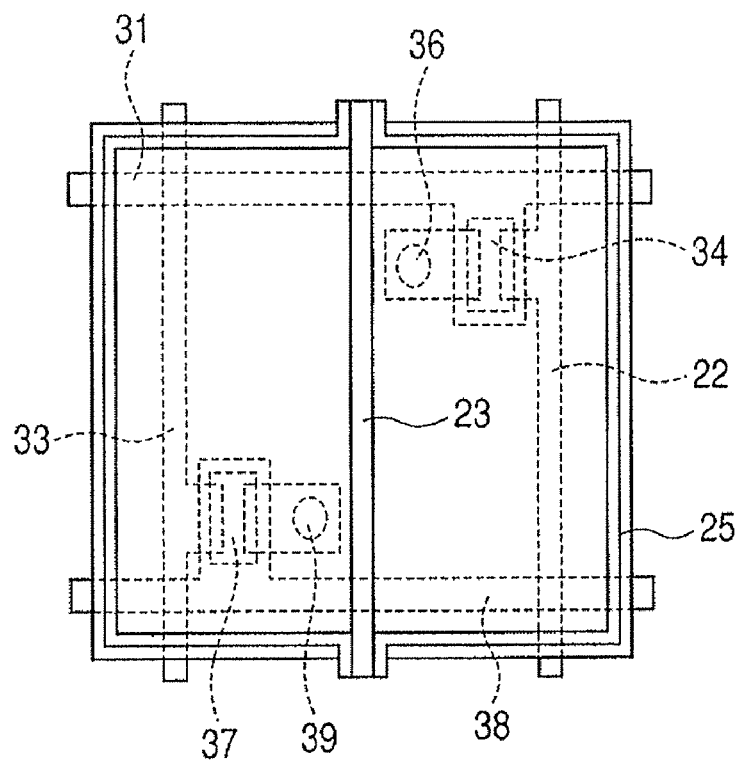
FIG. 7A is a plan view of a pixel according to Second Embodiment of the present invention.
Figure 7B:
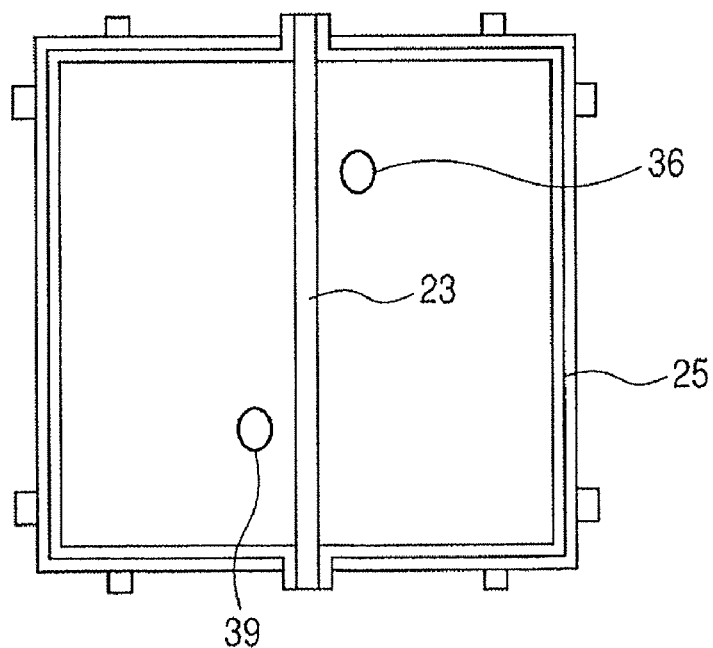
FIG. 7B is a plan view illustrating the appearance of a pixel according to Second Embodiment of the present invention.
Figure 8:
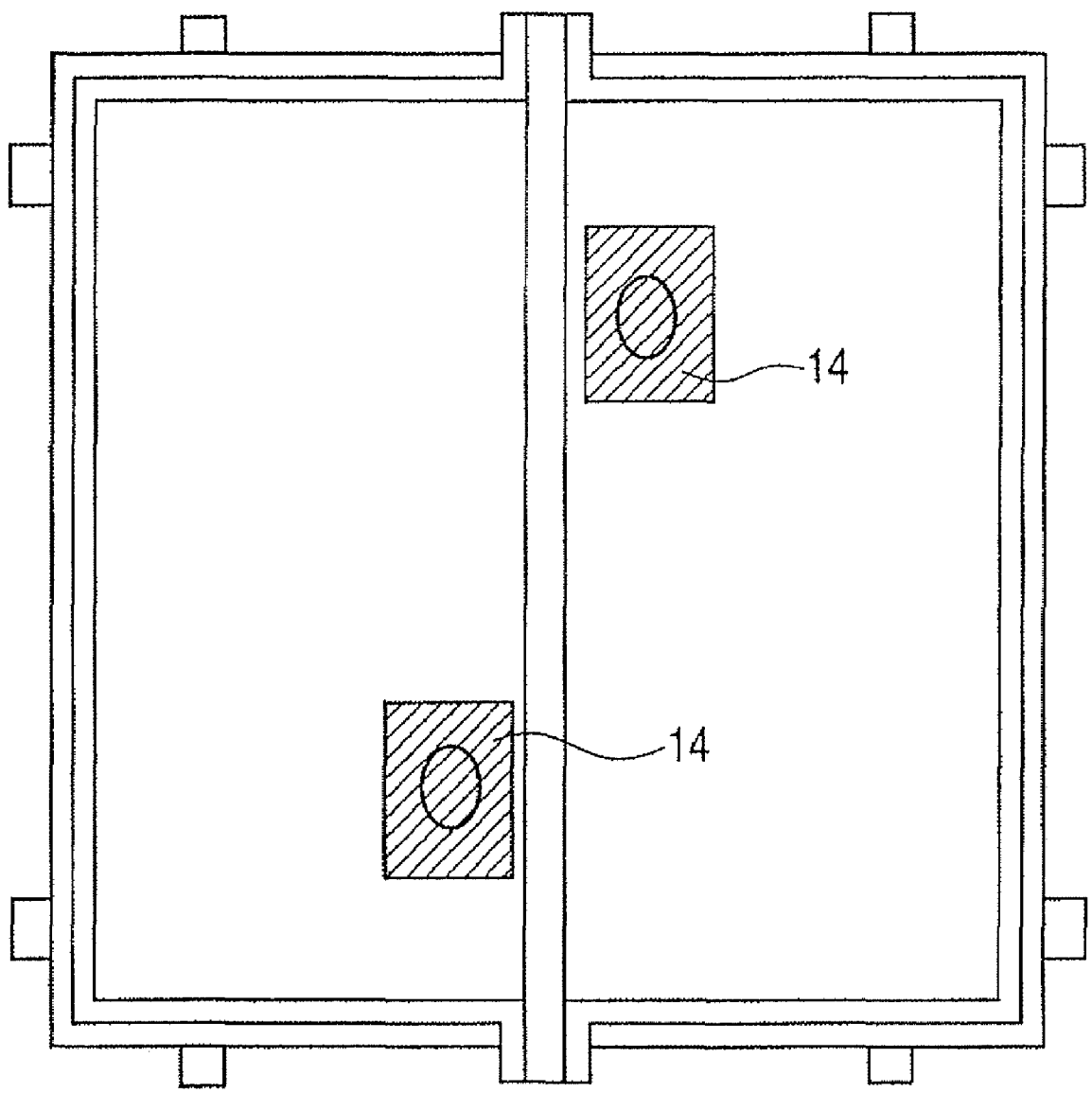
FIG. 8 is a plan view of a pixel according to Second Embodiment of the present invention.

FIGS. 7A and 7B are each a view illustrating a top-view structure according to Second Embodiment of the present invention; FIG. 7A is a plan view, and FIG. 7B is an imaginary external view of a pixel having the top-view structure illustrated in FIG. 7A in the case where the pixel is observed through a reflection-type optical microscope. FIG. 8 is a view illustrating laser-beam irradiation regions.

Figure 9A:
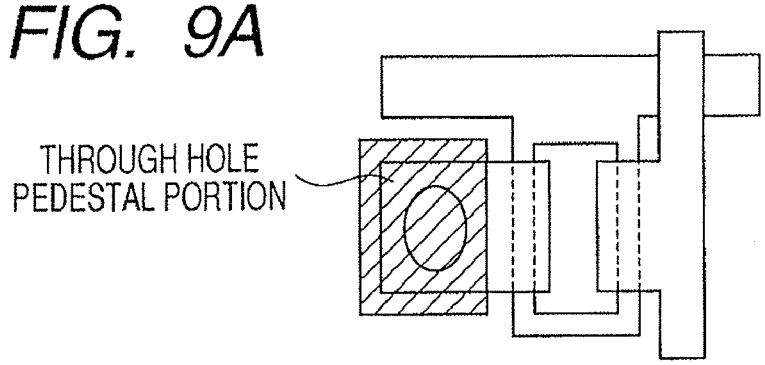
FIG. 9A is a plan view of only a TFT portion according to Second Embodiment of the present invention and illustrates the removed region of a contact hole pedestal portion.
Figure 9B:
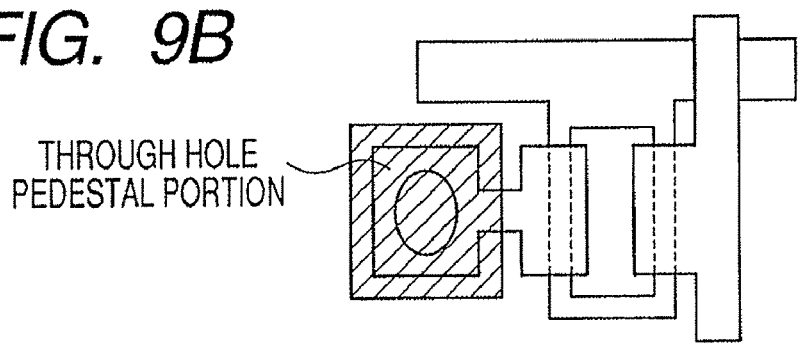
FIG. 9B is a plan view of only a TFT portion, having the source electrode or the drain electrode whose shape is different from that in FIG. 9A, according to Second Embodiment of the present invention, and illustrates the removed region of a contact hole pedestal portion.

FIGS. 9A to 9D are each a plan view of only TFT portion of the pixel illustrated in FIG. 7A; FIG. 9A is a plan view of an ordinary TFT, and FIG. 9B is a plan view of a TFT in another example.

FIG. 7A illustrates a pixel in which a conversion element 25 and two TFTs 34 and 37 as switching elements make a set. The first TFT 34, connected with a first gate wiring 31 and a signal wiring 22, is to transfer electric charges accumulated in the conversion element 25 to a signal processing circuit unit 51 that is arranged in the peripheral portion of the radiation-imaging sensor panel. The second TFT 37 is to apply a reset potential to the conversion element 25, by way of a reset wiring 33. Reference numeral 38 denotes a second gate wiring connected with the gate electrode of the second TFT 37. The conversion element 25 is placed over the first TFT 34 and the second TFT 37 with an interlayer insulating film inserted between them. A first contact hole portion 36 connects the conversion element 25 with the first TFT 34; a second contact hole portion 39 connects the conversion element 25 with the second TFT 37.

FIG. 7B is an imaginary external view of the pixel illustrated in FIG. 7A in the case the pixel is observed through a reflection-type optical microscope. The positions of the first TFT 34, the second TFT 37 and the respective wiring connected with the TFTs 34 and 37 cannot be recognized because visible light is absorbed by the conversion element disposed in the upper portion. In addition, when a flattening film having a flattening characteristic is utilized as the interlayer insulating film disposed between the conversion element 25 and the first and second TFTs 34 and 37, the level differences in the TFTs cannot be recognized; as a result, as illustrated in FIG. 7B, the positions of the TFTs and the wiring cannot be recognized.

In this situation, when, due to the intrusion of foreign materials, a defect is caused in the conversion element 25, it is required to electrically isolate the TFTs and the conversion element 25 from each other. For that purpose, as illustrated in FIG. 8, by irradiating a laser beam onto the first and second contact hole portions 36 and 39 as the laser-beam irradiation region 14 so as to remove the films that configure the conversion element 25 and the TFTs, the TFTs and the conversion element 25 can be electrically isolated from each other. In Second Embodiment, since two TFTs are connected with the conversion element 25 and the first and second contact hole portions 36 and 39 exist, respective laser beams are irradiated onto two positions. In this regard, however, it is also possible to form with a common conductive layer the drain electrode of the first TFT and the drain electrode of the second TFT and to connect at a single contact hole portion the common conductive layer with the conversion element 25; in this case, it is only necessary to remove the single contact hole portion.

FIGS. 9A to 9D each illustrate the shape of the source electrode or the drain electrode of the TFT illustrated in FIG. 7A and the relationship between the source electrode or the drain electrode of the TFT and the laser-beam irradiation region 14. Although not illustrated in the figures, in fact, a photoelectric conversion element is placed over the source electrode or the drain electrode of the TFT and the laser-beam irradiation region 14.

Figure 9C:
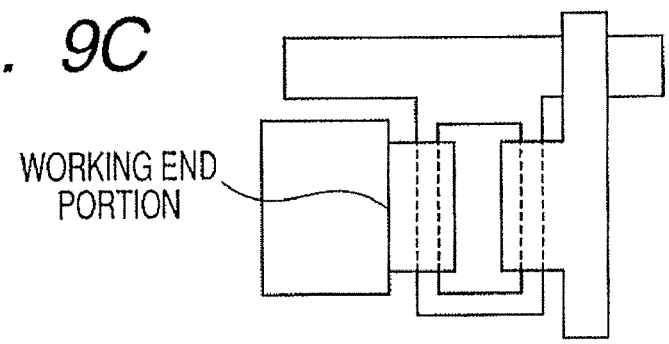
FIG. 9C is a view of the TFT portion illustrated in FIG. 9A in the case where the contact hole pedestal portion has been removed.
Figure 9D:
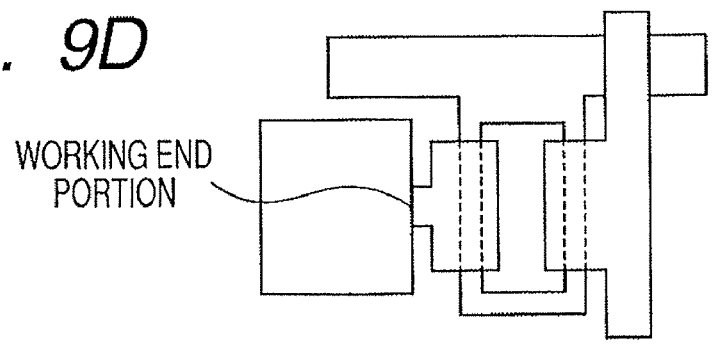
FIG. 9D is a view of the TFT portion illustrated in FIG. 9B in the case where the contact hole pedestal portion has been removed.

FIG. 9A is a figure in which the shapes of the source electrode and the drain electrode of the TFT illustrated in FIG. 7A are changed, and FIG. 9B is a figure in which the shape of the source electrode or the drain electrode of the TFT is changed. In addition, FIGS. 9C and 9D are figures in which the laser-beam irradiation regions 14 in FIGS. 9A and 9B, respectively, have been worked by means of a laser beam.

As illustrated in FIG. 9A, in this case, with regard to the laser-beam irradiation region, all the pedestal portion, which is connected at the contact hole portion, is removed. By removing all the films in the contact hole pedestal portion, the conversion element and the TFT can further stably be isolated from each other, even though the film, which has been removed in the laser-beam working, adheres again. In this regard, however, as long as the conversion element and the TFT can be isolated from each other, part of films in the contact hole pedestal portion may be left.

Next, the source electrode or the drain electrode in FIG. 9B, which has a shape different from that in FIG. 9A, is formed in such a way that, after a laser beam is irradiated so as to remove all the contact hole pedestal portion, the cross-sectional length of the metal film that is exposed at the end of the removed region becomes short. FIGS. 9C and 9D are figures in the case where working has been carried out; in FIG. 9D, the cross-sectional length of the source or drain electrode, exposed at the working end portion, of the TFT is approximately half to one thirds of that in FIG. 9C. As a result, even though, in the case a laser beam is irradiated so as to remove the films, the removed film adheres again, the probability that the re-adhesion film creates a short circuit between the TFT and the unillustrated conversion element 25 placed in the upper portion can be reduced. In addition, although not illustrated in the figures, it is desirable that, in order to reduce the probability that the short circuit is created, the thickness of the interlayer insulating film formed between the TFT and the conversion element 25 is 1.0 μm or larger in the vicinity of the laser-beam irradiation region 14. Additionally, it is desirable that the laser-beam irradiation is carried out in such a way that the contact hole portion including the tapered portion thereof is removed.

Third Embodiment

Figure 10:
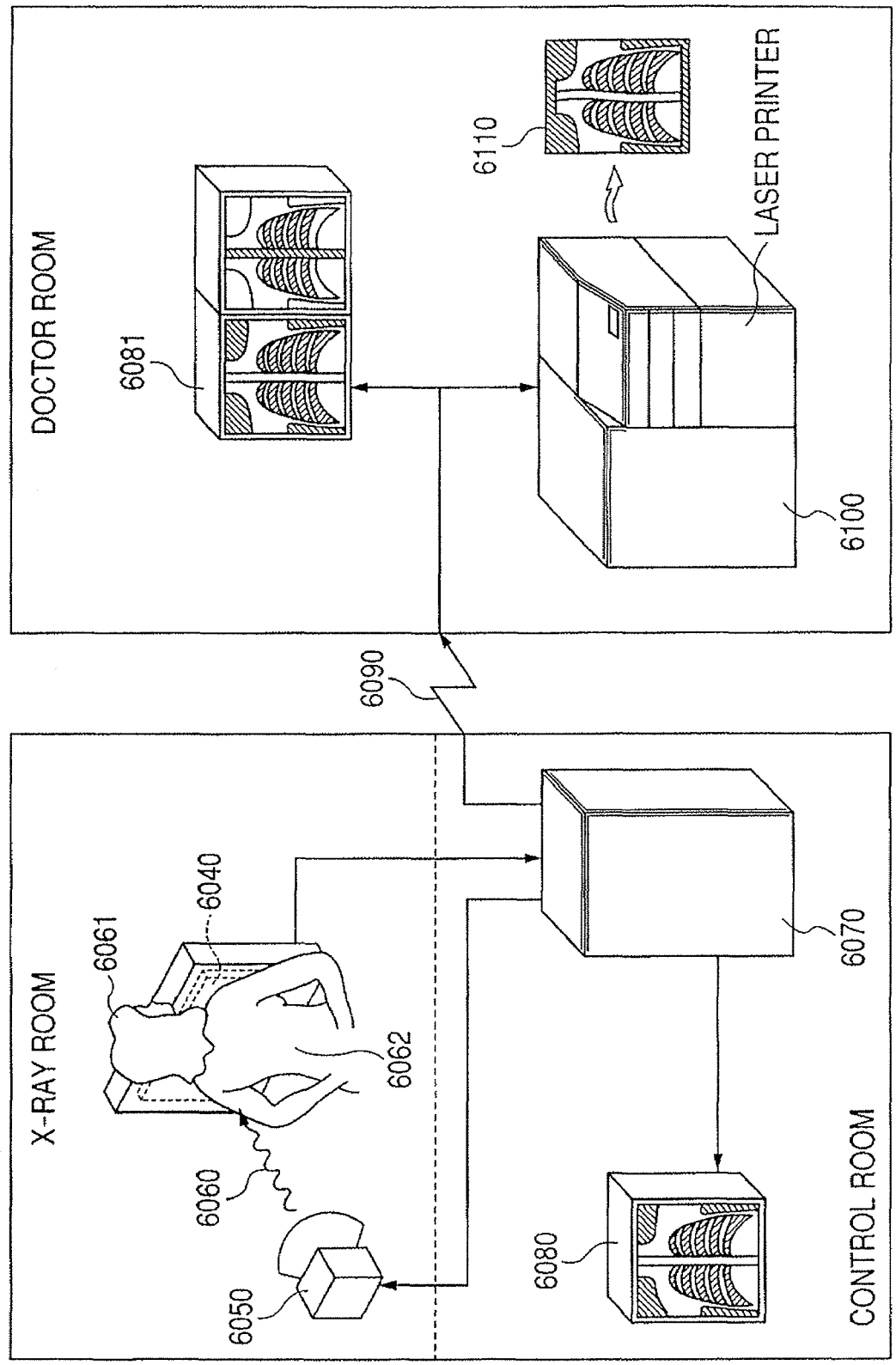
FIG. 10 is a schematic diagram for explaining an example in which a radiation imaging apparatus according to the present invention is applied to an X-ray diagnosis system.

FIG. 10 is a diagram illustrating an example in which a radiation imaging apparatus according to the present invention is applied to an X-ray diagnosis system.

As illustrated in FIG. 10, an X-ray 6060 generated in an X-ray tube 6050 that serves as a radiation generating source penetrates the pectoral region 6062 of a patient or a subject 6061, and then enters a radiation imaging apparatus 6040 having a scintillator (phosphor) mounted on the top side thereof. The incident X-ray includes the in-vivo information of the patient 6061. In response to the incidence of the X-ray, the scintillator emits light; the light is photoelectrically converted so that electric information is obtained. The information is converted into a digital signal and then image-processed by an image processor 6070 that serves as signal processing means, whereby the information can be observed on a display apparatus 6080 that is located in a control room and serves as display means.

Moreover, the information can be transferred to a remote place, through transmitting means such as a telephone line 6090. Still moreover, the information can be displayed on a display apparatus 6081 that is installed, e.g., in a doctor room located at another place and serves as display means, or can be stored in recording means such as an optical disk, thereby enabling a doctor at the remote place to make a diagnosis. Furthermore, the information can be recorded, by a film processor 6100 that serves as recording means, in a film 6110 that serves as a recording medium.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-020979, filed Jan. 30, 2006, which is hereby incorporated by reference herein in its entirety.

What is claimed is:

1. An imaging apparatus comprising:
a plurality of pixels arranged on an insulating substrate, each of the plurality of pixels comprising:
a thin-film transistor having a source electrode and a drain electrode;
a conversion element arranged over the thin-film transistor; and
an insulating film arranged between the thin-film transistor and the conversion element,
wherein the plurality of pixels include a pixel in which, through a contact hole provided in the insulating film, the source electrode or the drain electrode of the thin-film transistor and the conversion element are connected with each other; and a pixel in which the conversion element, the insulating film, and an electroconductive layer electrically connected to the source electrode or the drain electrode of the thin-film transistor are removed together so that an electric connection between the thin-film transistor and the conversion element is discontinued.

2. The imaging apparatus according to claim 1, wherein the discontinuing the electric connection between the thin-film transistor and the conversion element in the pixel is achieved by removing at least a part of a portion within the contact hole.

3. The imaging apparatus according to claim 2, wherein the pixel in which the electric connection is discontinued has a contact hole portion in which a tapered portion of the contact hole is removed.

4. The imaging apparatus according to claim 2, wherein, in the pixel in which the electric connection is discontinued, a contact hole portion and at least part of a region of the contact hole portion adjoining the source electrode or the drain electrode, is removed.

5. The imaging apparatus according to claim 1, wherein the thin-film transistor includes a signal transmitting thin-film transistor for transferring an electric signal from the conversion element and a reset thin-film transistor for resetting the photoelectric conversion element.

6. A radiation imaging apparatus comprising:
the imaging apparatus according to claim 1; and
a scintillator, arranged on the conversion element, for converting a radiation into light.

7. A radiation imaging apparatus comprising the conversion element according to claim 1, wherein the photoelectric conversion element is an element for converting a radiation directly into an electric charge.

8. A radiation imaging system comprising;
the radiation imaging apparatus according to claim 1;
signal processing means for processing a signal from the radiation imaging apparatus;
recording means for recording a signal from the signal processing means;
display means for displaying a signal from the signal processing means;
transmitting means for transmitting a signal from the Signal processing means; and
a radiation generating source for generating radiations.

* * * * *